Dec. 22, 1970 M. AVEN 3,549,434

LOW RESISTIVITY GROUP IIb-VIb COMPOUNDS AND METHOD OF FORMATION

Filed Sept. 19, 1968 3 Sheets-Sheet 1

INVENTOR:
MANUEL AVEN,
by John J. Kissane
HIS ATTORNEY

INVENTOR:
MANUEL AVEN,
by John J. Kissane
HIS ATTORNEY

INVENTOR:
MANUEL AVEN,
by John J. Kissane
HIS ATTORNEY

United States Patent Office 3,549,434

Patented Dec. 22, 1970

3,549,434

LOW RESISITIVITY GROUP IIb–VIb COMPOUNDS AND METHOD OF FORMATION

Manuel Aven, Burnt Hills, N.Y., assignor to General Electric Company, a corporation of New York Filed Sept. 19, 1968, Ser. No. 760,826
Int. Cl. H01l 7/62
U.S. Cl. 148—186 6 Claims

ABSTRACT OF THE DISCLOSURE

High power, low loss p-n junctions are formed in Group IIb–VIb compound wafers by firing the wafer in a liquid alloy of zinc and aluminum to diffuse the aluminum partially into the surface of said wafer, firing the wafer in selenium, sulfur or tellurium vapor to compensate the aluminum doped region and effect a p-type conductivity in the remainder of the wafer, and firing the wafer in zinc or cadmium vapor for a period preferably at least twice the period required for the metal to uncompensate a chalcogen-compensated aluminum-doped semiconductive region equal in thickness to the aluminum doped region to restore an n-type conductivity therein.

Figure 1:
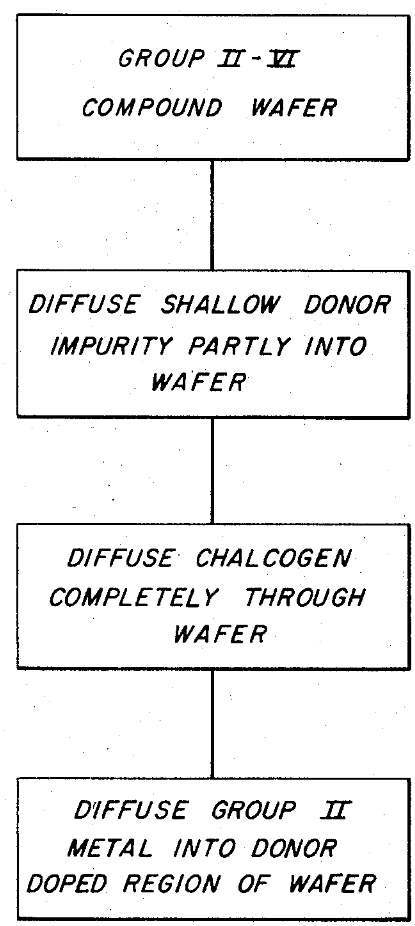

This invention relates to Group IIb–VIb compound semiconductors having substantially uncompensated n-type and p-type conductivity regions with a narrow transition region therebetween and to the method of forming the semiconductor junctions by a triple diffusion technique wherein the junction between the n-type conductivity and the p-type conductivity region of the wafer serves as a diffusion barrier to native defects restoring the n-type conductivity to a previously compensated periphery.

A common procedure in the fabrication of semiconductor junctions is the diffusion of appropriate foreign impurities into diverse regions of a suitable compound wafer to determine the electrical conductivity of the regions. In the preparation of junctions in Group IIb–VIb compounds by diffusion however, native lattice defects may diffuse in along with the intentionally indiffused foreign impurities or the diffusant may be compensated by defects already present in the wafer thereby rendering the junction highly resistive and reducing the maximum operating power level of the device. Thus, to avoid detrimental compensation of an intentionally incorporated dopant, it is desirable to enhance the concentration of native acceptor defects and minimize the concentration of native donor defects in the p-type conductivity region of the junction with exactly the reverse relationship being valid in the n-type conductivity region of the junction.

One technique heretofore employed to overcome the compensating effect of lattice defects upon a diffusant in the n-type conductivity region of the junction is disclosed in U.S. Pat. No. 3,390,311, issued June 25, 1968 in the name of M. Aven et al., wherein a bistable light emitting diode of zinc seleno-telluride is prepared by firing a suitable wafer in a zinc-aluminum alloy to diffuse the n-type conductivity producing impurity, i.e. aluminum, to a desired depth, thereby simultaneously, by virtue of the zinc-rich atmosphere prevailing during the diffusion, minimizing the concentration of native acceptor defects and maximizing the concentration of native donor defects throughout the whole volume of the wafer. Although diodes formed by this technique exhibit a high radiative quantum efficiency at low temperatures, the structure also is characterized by a high power dissipation due to the relatively high resistivity of the junction therein. The reason for this shortcoming is that the p-type conductivity side of the junction is left to contain a relatively large concentration of native donor defects, and contains very few native acceptor defects. The compensated p-type conductivity side of the diode therefore is characterized by resistivities in excess of $10^{10}$ ohm cm. at 77° K.

It is therefore an object of this invention to provide a low resistivity Group IIb–VIb compound semiconductive device in which both the n-type side and the p-type side contains the optimum concentration of the appropriate native lattice defects.

It is also an object of this invention to provide a novel method of preparing Group IIb–VIb compound semiconductive devices capable of exhibiting high power at reduced temperatures.

It is a further object of this invention to provide a method of preparing Group IIb–VIb compound semiconductive devices wherein the concentration of native acceptor impurities is enhanced in the p-type conductivity region and minimized in the n-type conductivity region of the semiconductive device.

These and other objects of this invention are achieved by a Group IIb–VIb wafer having a substantially uncompensated (i.e., exhibiting a resistivity of less than 200 ohm cm. at 300° K.) p-type conductivity region and a substantially uncompensated n-type conductivity region with a narrow transition zone therebetween. Structures of this nature can be formed by a triple diffusion process which includes diffusing a shallow donor impurity, i.e. a donor impurity having an ionization energy equal to or less than 0.05 ev., into a Group IIb–VIb compound wafer to produce an n-type conductivity region extending to a fractional portion of the wafer depth, diffusing a chalogen selected from the group consisting of selenium, sulfur and tellurium through the wafer to produce native defects completely compensating the n-type conductivity in the shallow donor doped region and producing a p-type conductivity region interiorly of said shallow donor doped region, and subsequently diffusing a metal selected from the group consisting of zinc and cadmium into said compensated donor doped region to reinstate the n-type conductivity therein. Preferably aluminum is employed as the shallow donor impurity and the period of the Group IIb metal diffusion is at least twice the theoretical period required for the metal to uncompensate the aluminum doped region of the semiconductor.

Figure 2:
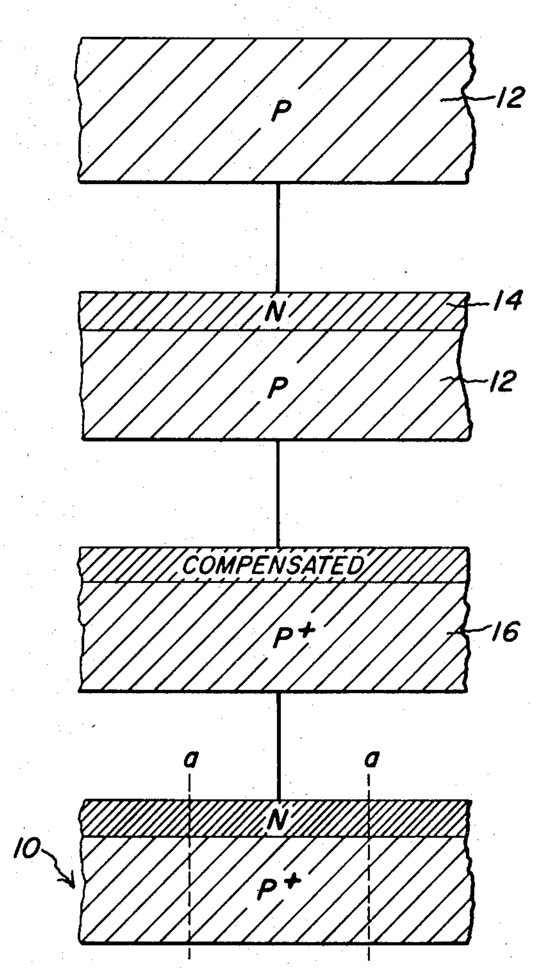
Figure 3:
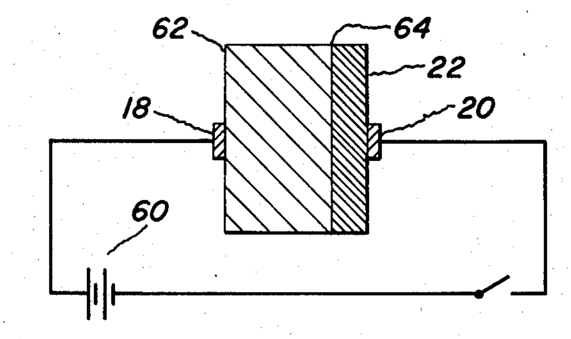
Figure 4:
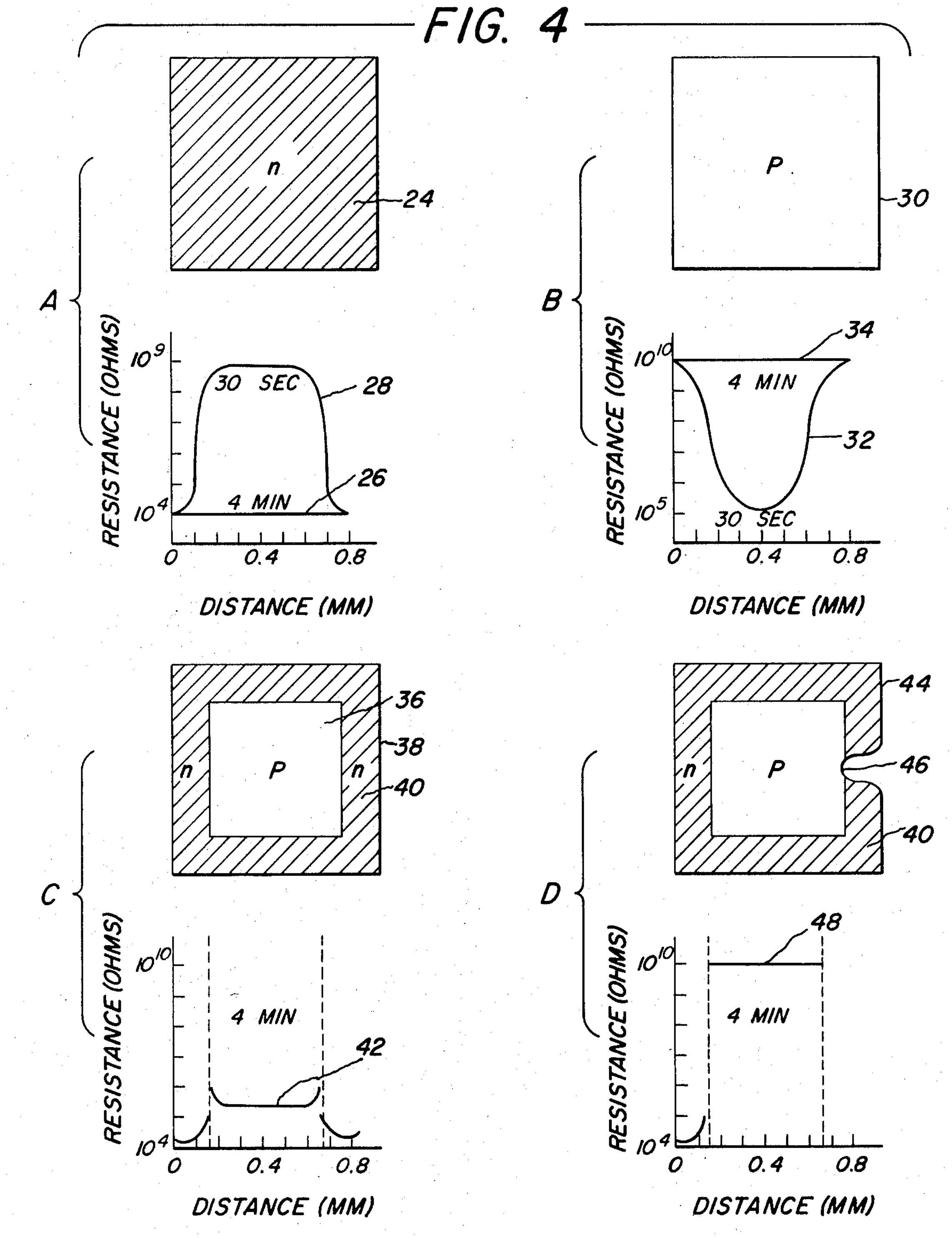
Figure 5:
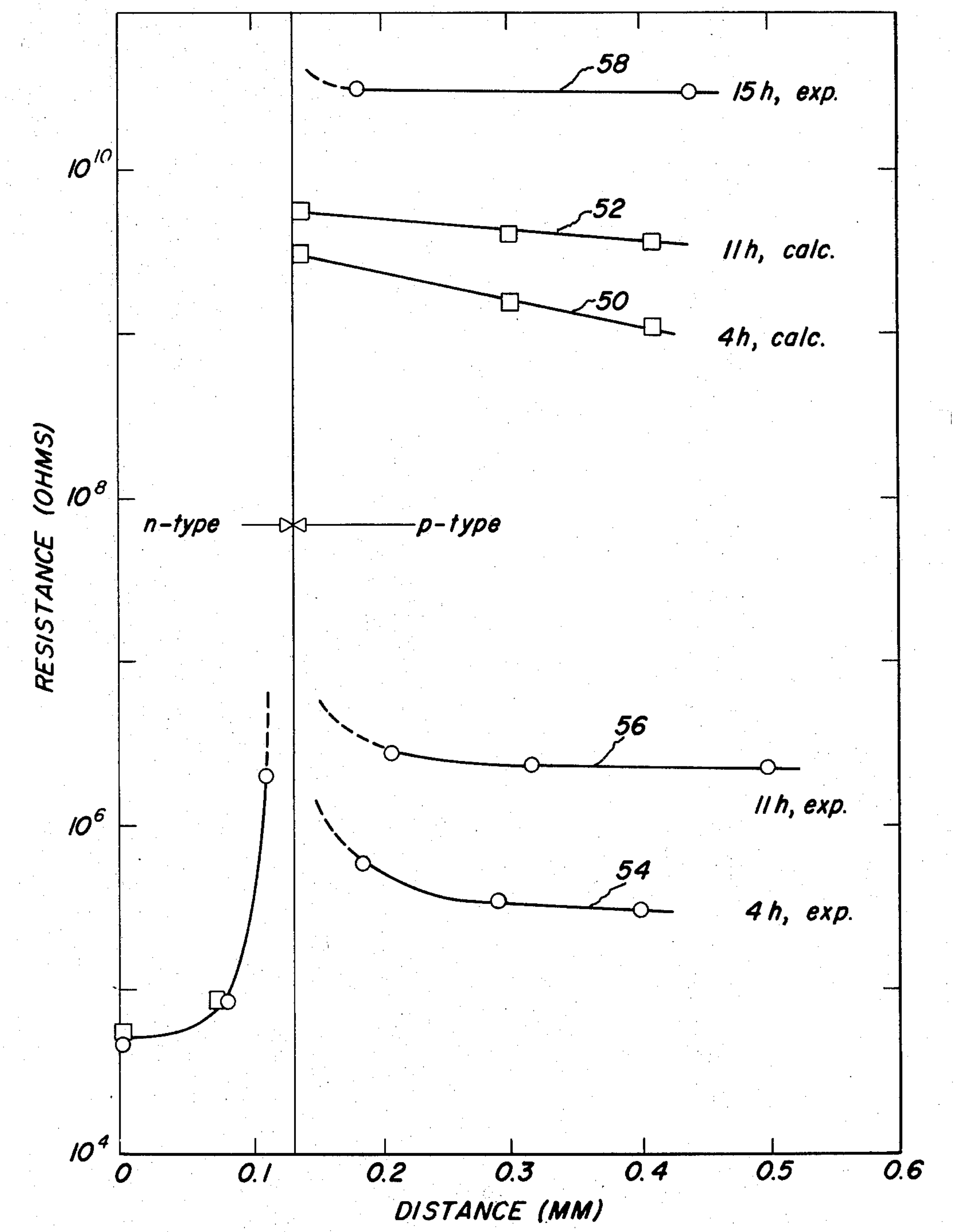

The novel features believed characteristic of the invention are set forth in the appended claims. The invention itself, together with further objects and advantages thereof may best be understood by reference to the following description, taken in connection with the accompanying drawings, in which:

FIG. 1 is a flow chart depicting in block diagram form the triple diffusion technique of this invention, FIG. 2 is a pictorial illustration of the semiconductor fabrication technique of this invention, FIG. 3 is a plan view of a semiconductor fabricated by the techniques of this invention, FIG. 4 is a pictorial illustration depicting the diffusion profiles of native acceptor defects in various $ZnSe_xTe_{(1-x)}$ crystals, and FIG. 5 is a graph comparing the calculated and experimental diffusion profiles of native acceptor defects in $ZnSe_xTe_{(1-x)}$ crystals.

The method of forming low resistivity Group IIb–VIb compound devices 10 in accordance with this invention is depicted in FIGS. 1 and 2 and generally includes the diffusion of a shallow donor impurity into a Group IIb–VIb compound wafer 12 to form an n-type conductivity region 14 extending to a desired depth in wafer 12, diffusing a chalcogen into the wafer to completely compensate donor doped region 14 and produce a high p-type conductivity region 16 beneath the compensated region and subsequently diffusing a Group IIb metal into the wafer to reinstate the high n-type conductivity in previously compensated region 14. The wafer then can be disected along lines AA of FIG. 2 and electrode in conventional fashion, e.g. with a gold silver, lithium, or lead contact 18 upon the p-type conductivity region 16 and an indium, or gallium contact 20 on the n-type region of the wafer, to produce diode 22 of FIG. 3 having both a low resistivity n-type side and a low resistivity p-type side with a narrow transition region therebetween.

Wafer 12 preferably is a single phase monocrystalline body of a Group II*b*–VI*b* compound with the metal and chalcogen chosen for the wafer being highly dependent upon the desired utilization for the finished device, e.g. whether the wafer is to be utilized primarily in a semiconductive, photovoltaic or electroluminescent device. For most practical purposes, however, the Group II*b* metal forming the wafer is zinc, cadmium, or mixtures thereof while the chalcogens forming wafer 12 generally are limited to selenium, sulfur and tellurium and their mixtures. More specifically, the method of this invention can be utilized in the fabrication of junctions in binary chalcogenide compounds, such as zinc sulfide, zinc selenide, zinc telluride and the corresponding cadmium compounds, as well as in the formation of junctions in pseudo-binary chalcogenide compounds, such as zinc seleno-telluride, zinc seleno-sulfide cadmium seleno-telluride, cadmium seleno-sulfide, etc., containing a complex anion or a mixed cation for greater versatility with respect to band gap or desired spectral distributions. Particularly advantageous compounds for electroluminescent purposes are seleno-telluride compounds, e.g. $ZnSe_xTe_{(1-x)}$ wherein $x$ lies between 0.1 and 0.7 and is preferably between 0.4 and 0.5, because of the ability of these compounds to be made both highly conductive n-type and highly conductive p-type upon suitable doping and uncompensation. The binary Group II*b*–VI*b* compounds, such as ZnSe and ZnS, advantageously can be employed to form semiconductive devices having photo hetero-junctions characterized by a region of a n-type dark conductivity juxtaposed against a region of p-type photo-conductivity. Upon illumination with a suitable activating source such as gallium arsenide diode, the photo hetero-junction functions as a regular injection electroluminescent diode.

The II–VI compound wafer 12 can be fabricated by any conventional technique for forming a single phase homogeneous crystalline structure of the desired compound. For example, chalcogenide pseudo-binary wafers such as $ZnSe_xTe_{(1-x)}$ can be formed by the technique described in copending U.S. application Ser. No. 714,590, filed Mar. 20, 1968, in the name of M. Aven et al., and assigned to the assignee of the present invention (the disclosure of which application is incorporated herein by reference) wherein a charge of zinc selenide and zinc telluride powders fired in flowing dry hydrogen to form $ZnSe_xTe_{(1-x)}$ and sintered at 1025° C. is positioned in an enclosed quartz tube with elemental tellurium and a zinc seleno-telluride seed crystal. The tube then is evacuated to a pressure of approximately $10^{-5}$ torr at substantially room temperature whereupon the tube is positionde in a first temperature profile effecting a substantial vapor pressure within the envelope and heating the seed crystal to a relatively higher temperature at which temperature the crystals is thermally etched to provide a nucleation surface for subsequent crystal growth. The temperature profile of the tube then is altered to effect slow volatilization of the sintered mixture with the seed crystal being heated to a slightly, e.g. 5° C., lower temperature. In the second temperature profile, zinc seleno-telluride nucleates upon the seed crystal and a $ZnSe_xTe_{(1-x)}$ crystal if grown epitaxially. If desired, the wafer thus formed may be made more strongly p-type by the diffusion of a p-type conductivity inducing impurity, such as copper or phosphorus, uniformly through the wafer in a concentration in the range of $10^{17}$ to $10^{18}$ atoms/cm. without adversely affecting the suitability of the wafer for utilization in this invention. Alternatively, phosphorus could be added during the sintering step and thus incorporated into the powder charge and therefore into the growing crystal. Similarly, other known methods of forming Group II*b*–VI*b* compounds such as the methods of forming Group II*b*–VI*b* crystals described and claimed in U.S. Pat. No. 3,243,267 issued Mar. 29, 1966 in the name of W. W. Piper, also can be employed to form wafer 12. The preparation of these and other Group II*b*–VI*b* compound wafers suitable for this invention also are disclosed in Chapter 2 of the first edition of a book entitled: "Physics and Chemistry of II–VI Compounds" edited by Aven and Prener, published by the North-Holland Publishing Company (1967).

To form a low resistivity junction in accordance with this invention, a strong n-type conductivity region 14 is formed along the surface of the undoped, or p-type conductivity doped, wafer 12 by the diffusion of a suitable shallow donor impurity such as aluminum to a fractional portion, e.g. less than ½, of the wafer depth. Diffusion may be accomplished by immersing the semiconductor crystal in an alloy of the Group II*b* metal forming the wafer and the activating impurity, e.g. aluminum, and firing the wafer until the impurity has diffused to the desired depth in concentrations of $5\times10^{16}$ to $5\times10^{19}$ atoms/cm. In one specific instance, firing a 2 x 2 x 1 millimeter³ vapor grown undoped $ZnSe_xTe_{(1-x)}$ crystal in a zinc-aluminum alloy solution containing 99% by weight zinc and 1% by weight aluminum for 16 hours at 900° C. produced a strong aluminum doped n-type conductivity region 14 extending to a depth of 0.1 millimeter in the crystal with the underlying undoped portion of the crystal exhibiting a weak p-type conductivity. The aluminum doped region characteristically exemplifies a resistivity between 0.1 ohm cm. and 100 ohm cm. at room temperature. Other shallow donor impurities known as suitable for Group II*b*–VI*b* compounds, e.g. the halogens and certain rare earths such as lanthanum, holmium and erbium, also can be employed to produce n-type conductivity region 14 in the wafer surface. In general, halogenic doping of the wafer can be effected by the application of zinc bromide, hydrogen chloride, or cadmium fluoride, for example, to the wafer in the vapor phase while the rare earth dopants preferably are applied by means of a liquid Group II*b*, or Group VI*b*, alloy such as zinc-erbium, or selenium-erbium, for example.

After doping with the shallow donor impurity, the wafer is fired in a chalcogen atmosphere of sulfur, tellurium, or selenium, preferably in a saturated atmosphere of the chalcogen forming the wafer. This compensates the n-type conductivity in aluminum doped surface 14 while producing a high p-type conductivity in the underlying region 16 of the wafer. In a specific instance, firing a 1 millimeter thick $ZnSe_xTe_{(1-x)}$ wafer having an n-type conductivity surface approximately 0.1 millimeter deep produced by aluminum concentration of $10^{19}$ atoms/cm.³ in a saturated tellurium vapor for two hours at 750° C. has been found to completely compensate the aluminum doped region of the wafer while resulting in an uncompensated acceptor concentration in the inside of the wafer in a sufficient magnitude, e.g. $10^{17}$ atoms/cm.³, to render region 16 p-type conducting with a resistivity at room temperature of 0.1–100 oms cm. p-type conductivity may include the reduction in the number of native donors in the $ZnSe_xTe_{(1-x)}$ wafers and/or the incorporation of native acceptors into region 16 based upon a tellurium excess. Temperatures from 575° C. to 775° C. have been successfully employed for firing $$ZnSe_xTe_{(1-x)}$$

crystals in saturated tellurium vapor with the period of the firing being at least the minimum time required to diffuse the native defect based on excess tellurium completely through the wafer. Firing the wafer in tellurium at temperatures above 850° C. however produces irreversible changes in the wafer detrimental to the proper performance of the method of this invention.

Subsequent to the diffusion of the p-type conductivity inducing defect into the wafer to render region 16 with a p-type conductivity and compensate aluminum doped region 14, the wafer is fired in an n-type defect inducing atmosphere, e.g. zinc or cadmium, to reinstate the initial strong n-type conductivity in region 14 by annihilation of the previously in-diffused native defects based on chalcogen excess. Firing the wafer in saturated zinc vapors for a period of four to 10 minutes at 775° C. (for one to 11 hours at 575° C.) has been found to produce a strong n-type conductivity, i.e., a resistivity of 0.1–100 ohms cm. at room temperatures, in an approximately 0.1 millimeter aluminum doped, tellurium compensated region of a 1 millimeter thick $ZnSe_xTe_{(1-x)}$ wafer without penetrating sufficiently into p-doped region 16 to destroy the p-type conductivity therein.

The failure of the zinc vapor to penetrate through the aluminum doped surface of the wafer into p-type conductivity region 16 employing the above specified diffusion times during the final diffusion step is an unexpected phenomenon in view of the rapid diffusion rate of the un-compensating defect. Thus in accordance with Ficks' law, the diffusion rate of an impurity into a body can be calculated from the approximate formula $$C(X)=C(O)e^{\frac{-x^2}{4Dt}}$$

wherein:

C(X) is the concentration of the impurity of the distance X within the wafer,
C(O) is the concentration of the impurity at the surface of the wafer,
X is the distance within the wafer,
D is the diffusion constant of the diffusing defect, and
$t$ is the time of the diffusion.

Using the estimated values for the diffusion coefficients in conjunction with the above equation, one would estimate that firing the wafer in zinc vapors for four to 10 minutes at 775° C. would extend the uncompensated region through distances many times the thickness of aluminum doped surface 14 to significantly reduce the p-type conductivity of region 16. For example, as shown in FIG. 4A, an approximately 0.8 millimeter thick $ZnSe_xTe_{(1-x)}$ crystal 24 homogeneously doped with aluminum and fired in tellurium vapor until completely compensated throughout the entire crystal thickness to produce a crystal resistance of $10^9$ ohm at 300° K. [determined in accordance with the techniques described in an article by M. Aven et al. in Physical Review, vol. 137A, No. 1A, A228 (1965)] is completely uncompensated by a four minute firing of the crystal at 775° C. in saturated zinc vapor as exemplified by horizontal line 26 corresponding to a resistance of approximately $10^4$ ohms. Firing of the tellurium compensated aluminum doped crystal for 30 seconds in a 775° C. furnace results in an uncompensation of the crystal over a distance roughly equivalent to 0.1 millimeter, as portrayed by diffusion profile curve 28. Thus the Group II*b* metal diffusion period employed in this invention, e.g. from one to four minutes at 775° C., to uncompensate region 14 is at least twice the period required for the metal to uncompensate a tellurium compensated aluminum doped semiconductive region equal in thickness to region 14.

The complementary diffusion profile of a 0.8 millimeter thick $ZnSe_xTe_{(1-x)}$ crystal 30 fired in tellurium vapor to a uniform resistance of approximately $10^5$ ohms at 77° K. [a more convenient temperature for carrying out precise diffusion profile determinations in p-type Zn $Se_xTe_{(1-x)}$ for p-type conduction is depicted in FIG. 4B. Upon firing at 775° C. for 30 seconds in a saturated zinc vapor, the crystal is compensated over a distance of approximately 0.15 millimeter, as is illustrated by profile curve 32, while firing of the crystal for four minutes at 775° C. results in a completely compensated crystal characterized by profile curve 34. The profile curves of FIGS. 4A and 4B are illustrative of typical diffusion profiles produced by the diffusion of native impurities into a semiconductor. However, as can be seen from FIG. 4C, a p-type conductivity region 36 in a $ZnSe_xTe_{(1-x)}$ crystal 38 completely enclosed by a compensated 0.15 millimeter thick aluminum doped periphery 40 formed by firing the aluminum doped crystal at 775° C. for 2 hours in saturated tellurium vapor is shielded during a subsequent firing of the crystal at 775° C. in saturated zinc vapors and exhibits a resistance of approximately $10^5$ ohms after a four minute firing interval, as exemplified by profile curve 42. No significant alteration in the resistance of p-type conductivity interior region 36 was observable even after 10 minutes firing in the saturated zinc vapor. When a crystal 44, illustrated in FIG. 3D and identical to crystal 38 of FIG. 3C except for a complete removal (identified by reference numeral 46) of a portion of compensated aluminum doped region 40 by filing of the crystal to a depth of approximately 0.17 millimeter, was fired in saturated zinc vapors at 775° C. for four minutes, the diffusion profile 48 of the wafer indicated a high resistance of $10^{10}$ ohms throughout the entire thickness of the interior region of the crystal.

While it is to be realized that the resistance measurements of FIG. 4 were made under artificial condition, e.g. the resistances of various regions of the crystal were measured at differing temperatures and included bulk as well as contact resistance etc., and therefore are not indicative of the resistance of semiconductor devices formed in accordance with this invention, the measured resistances illustrated by the graphs of FIG. 4 permit an accurate determination of the relative penetration of the diffusion fronts into the various crystals.

The unexpected retardation of diffusion of the native defect promoted by the Group II metal by the junction between an aluminum-doped n-type periphery and a p-type interior of a Gorup II–VI semiconductor is further illustrated in the graphs of FIG. 5 wherein the theoretical calculated resistance (employing the heretofore mentioned Fick formula) and the experimental resistance of a p-type conductivity region underlying a 0.13 millimeter thick n-type conductivity region is compared. In the theoretical analysis, the proper diffusion constants, i.e. $7\pm4\times10^9$ cm.²/sec. and $7\pm4\times10^{-8}$ cm.²/sec. for n-type and p-type material respectively, were substituted into the Fick formula and the diffusion profiles of the Group II*b* metal impurity was calculated. Assuming the diffusion to follow Ficks' law and to change abruptly at the p-n junction, a theoretical diffusion profile of a Group II*b* metal fired in saturated zinc vapor at 575° C. was calculated for diffusion periods of 4 and 11 hours, as exemplified by curves 50 and 52, respectively, of FIG. 5. Several 2 x 2 x 1 cubic millimeter $ZnSe_xTe_{(1-x)}$ crystals then were prepared in accordance with the techniques disclosed in previously cited U.S. patent application Ser. No. 714,590 and the crystals were doped with aluminum to a depth of 0.13 millimeter by firing the crystals for 16 hours at 900° C. in an alloy bath containing 99% zinc and 1% aluminum. After the doped crystals were fired in tellurium vapor for two hours at 775° C. to completely compensate the aluminum diffusion zone and produce high p-type conductivity throughout the remainder of each crystal, the crystals were fired for 4, 11 and 15 hours at 575° C. in a saturated zinc atmosphere to form diffusion profiles 54, 56 and 58, respectively. The diffusion profile of the zinc into the wafers then was determined in accordance with the techniques disclosed in the heretofore mentioned Physical Review of M. Aven et al. article. As can be noted from a comparison of the theoretically calculated profile curves with the profile curves of the experimentally formed crystals, the resistance profiles of the p-type conductivity interiors of the experimentally formed crystals having 4 and 11 hour diffusion periods were approximately three factors of 10 lower than the resistance profiles theoretically calculated for the identical wafers utilizing the approximate Fick's formula. When the experimental crystal was fired for 15 hours at 575° C. in the saturated zinc vapor however, the resistance of the p-type conductivity interior increased significantly to approximately $5 \times 10^{10}$ ohm indicating that the indiffusing zinc vapor, after an initial period of accumulation on the n-type conductivity side of the p-n junction boundary lasting for a period less than 15 but more than 11 hours, had broken through into the p-type conductivity interior. Thus the maximum Group II*b* metal diffusion period employed as the final step in the triple diffusion process of this invention should be less than 15 hours, e.g. less than approximately 30-fold the period required for the Group II*b* metal to uncompensate a homogeneous compensated aluminum doped crystal equal in thickness to the aluminum diffusion region 14. In general, the minimum Group II*b* metal diffusion period preferably should be greater than approximately two-fold the period required for the metal to substantially uncompensate a homogeneous compensated aluminum doped crystal equal in thickness to the aluminum diffusion region 14 to assure a high n-type conductivity in region 14.

Although the exact mechanism for the hold-up of the indiffusing Group II*b* metal is not fully understood, as yet, the inability to represent the diffusion of the defect involved across the p-n junction boundary by a continuous diffusion function may arise from depletion, accumulation or interaction between defects near the p-n junction boundary. It is also possible that more than one native defect is involved; for example, the in-diffusing Group II*b* metal may have to first react with isolated or precipitated interstitial chalcogen before it can proceed to fill the Group II*b* metal vacancies.

The advantageous effects of the triple diffusion technique of this invention upon the resistance of Group II–VI semiconductors was illustrated by the formation of two $ZnSe_{.5}Te_{.5}$ crystals from the same boule utilizing the techniques of the previously cited copending Aven et al. patent application. One crystal was fabricated into a diode by the diffusion of aluminum into the wafer employing the techniques of U.S. Pat. 3,390,311 while the second crystal was prepared by the triple diffusion method of this invention. The $ZnSe_{.5}Te_{.5}$ diode formed by the conventional diffusion of aluminum into the seleno-telluride wafer required 200 volts to pass 0.1 milliamp at 77° K. while the junction formed by heating the 2 x 2 x 1 $mm.^3$ crystal for 16 hours at 900° C. in a liquid alloy of 99% by weight zinc and 1% by weight aluminum, firing the crystal for two hours at 775° C. in a saturated tellurium vapor and firing the crystal for four minutes at 775° C. in saturated zinc vapor was found to pass 0.1 milliamp at 77° K. with an applied voltage of only six volts. The minimum applied voltage required to pass 0.1 milliamp at 77° K. for the very best diodes formed by the conventional technique was 16 volts, e.g. ten volts higher than required by diodes formed by the triple diffusion method. When the diode formed by the method of this invention was employed as a light emitting diode, e.g. by the application of the positive and negative terminals of voltage source 60 to the n-type conductivity region and the p-type conductivity regions respectively of diode 22, light emission was initiated even in the dark at 77° K. utilizing a 13-volt source while diodes formed by conventional diffusion techniques required either an external light source or a significantly higher voltage, e.g. 25 volts, to initiate the emission of light rays from the diodes. Diodes formed by the triple diffusion techniques also were successfully operated at room temperature at 8 volts and 20 milliamps for sustained periods while conventionally formed diodes broke down almost immediately when 20 milliamp current was passed through them.

Diode 22 also is characterized by a substantially uncompensated p-type conductivity region 16, typically having a thickness of 0.2 millimeter, and a substantially uncompensated conductivity region 62, typically having a thickness of 0.1 millimeter, exhibiting resistivities less than 200 ohm cm. to p-type and n-type conduction, respectively, at room temperature, with a narrow transition region 64 therebetween. At 77° K., the resistivities of the p-type conductivity region and the n-type conductivity region of diode 22 are less than $10^5$ ohms cm.

Similarly, ZnS photo hetero-junctions can be formed by the growth of a ZnS crystal employing the techniques disclosed in Chapter 2 of the heretofore mentioned Aven and Prener book and doping the crystal with copper in approximate concentrations of $5 \times 10^{16}$ to $5 \times 10^{19}$ atoms/$cm.^2$ to provide a dopant promoting p-type photo conductivity throughout the crystal. The crystal then is fired in saturated aluminum vapor at 1100° C. for 70 hours to produce an approximately 1 millimeter deep aluminum diffusion zone within the wafer periphery whereupon the wafer is fired at 800° C. in saturated sulfur vapors for 2 hours to compensate the aluminum diffusion zone and provide p-type photo-conductivity in the underlying portion of the wafer. Subsequent firing of the wafer in liquid zinc for one hour at 900° C. uncompensates the aluminum and extracts the copper from the aluminum doped region of the wafer permitting the wafer to be dissected and suitably electroded at the aluminum diffusion zone and the p-type conductivity zone to form a photo hetero-junction diode.

Although the method of this invention for forming unique low resistivity Group II*b*–VI*b* semiconductors is described as a triple diffusion process, the individual steps can be combined without departing from the scope of this invention. For example, when a copper doped zinc sulfide crystal is employed as the Group II*b*–VI*b* wafer, the aluminum diffusion and sulfur firing can be combined in a single step by firing the crystal in the vapors of aluminum and sulfur to simultaneously produce a compensated periphery and a p-type photo-conductivity interior. The crystal then is fired in liquid zinc to extract copper from the aluminum doped periphery and to uncompensate the aluminum donors by providing an excess of zinc over sulfur in the peripheral portion of the crystal. In spite of this variation in combining sequential steps, still three diffusions are involved: (1) the diffusion of aluminum into the peripheral part of the crystal, (2) the diffusion of excess sulfur into the whole crystal, and (3) the in-diffusion of excess zinc into the re-doped periphery.

What I claim as new and desire to secure by Letters Patent of the United States is:

1. A method of forming an asymmetrically conducting junction in a Group II*b*–VI*b* compound wafer comprising:

(A) Diffusing a shallow donor impurity into said wafer to produce an n-type conductivity region extending to a fractional portion of said wafer depth, (B) Diffusing a chalcogen selected from the group consisting of selenium, sulfur, tellurium and mixtures thereof completely through said wafer to produce native defects completely compensating said n-type conductivity in said donor doped region and enhancing the p-type conductivity region underlying the said donor doped region, and (C) Subsequently diffusing a metal selected from the group consisting of zinc, cadmium and mixtures thereof into said shallow donor doped region to produce an n-type conductivity therein by annihilation of the previously in-diffused native defects based on chalcogen excess.

2. A method of forming an asymmetrically conducting junction in a Group II*b*–VI*b* wafer according to claim 1 wherein said shallow donor is aluminum and said final metal diffusion period is at least twice the period required for the metal to uncompensate a zone in a chalcogen-compensated aluminum doped homogeneous semiconductive wafer, said zone being equal in thickness to the aluminum-doped region of the Group II–VI compound wafer.

3. A method of forming an asymmetrically conducting junction in a Group II*b*–VI*b* wafer according to claim 2 wherein said wafer is a monocrystalline body of zinc seleno-telluride having the formula $$ZnSe_xTe_{(1-x)}$$

wherein $x$ is in a range from 0.1 to 0.7.

4. A method of forming an asymmetrically conducting junction in a Group II*b*–VI*b* wafer according to claim 3 wherein said chalcogen is tellurium and said subsequently diffused metal is zinc.

5. A method of forming an asymmetrically conducting junction in a Group II*b*–VI*b* wafer according to claim 4 wherein the diffusion in tellurium atmosphere is a temperature in the range from 550° C. to 850° C.

6. A method of forming an asymmetrically conducting junction in a Group II*b*–VI*b* wafer according to claim 1 wherein said shallow donor is aluminum and said final metal diffusion period is between 2 and 30 times the period required for the metal to completely compensate a homogeneous compensated aluminum doped Group II*b*–VI*b* crystal equal in thickness to the aluminum doped region of the wafer.

References Cited

UNITED STATES PATENTS

| | | | |
|---|---|---|---|
| 3,282,749 | 11/1966 | Woodbury | 148—189 |
| 3,326,730 | 6/1967 | Mandel et al. | 148—189 |
| 3,390,311 | 6/1968 | Aven et al. | 317—237 |

L. DEWAYNE RUTLEDGE, Primary Examiner

R. A. LESTER, Assistant Examiner

U.S. Cl. X.R.

148—1.5, 188, 189; 317—237